US006858900B2

(12) United States Patent
Chen et al.

(10) Patent No.: US 6,858,900 B2
(45) Date of Patent: Feb. 22, 2005

(54) ESD PROTECTION DEVICES AND METHODS TO REDUCE TRIGGER VOLTAGE

(75) Inventors: Wei-Fan Chen, Taichung (TW); Shi-Tron Lin, Taipei (TW); Chuan-Jane Chao, Hsinchu (TW)

(73) Assignee: Winbond Electronics Corp, Hsinchu (TW)

( * ) Notice: Subject to any disclaimer, the term of this patent is extended or adjusted under 35 U.S.C. 154(b) by 149 days.

(21) Appl. No.: 09/973,291

(22) Filed: Oct. 8, 2001

(65) Prior Publication Data

US 2003/0067040 A1 Apr. 10, 2003

(51) Int. Cl.[7] .................. H01L 23/62; H01L 31/111; H01L 29/74
(52) U.S. Cl. .................. 257/360; 257/173; 257/174; 257/355; 257/356; 257/357; 257/358; 257/359; 257/361; 257/362; 257/363
(58) Field of Search .................. 257/355–363, 257/173–174

(56) References Cited

U.S. PATENT DOCUMENTS

| | | | |
|---|---|---|---|
| 5,248,892 A | | 9/1993 | Van Roozendaal et al. . 257/357 |
| 5,559,352 A | * | 9/1996 | Hsue et al. .................. 257/328 |
| 5,679,971 A | * | 10/1997 | Tamba et al. ............... 257/357 |
| 5,701,024 A | * | 12/1997 | Watt ............................. 257/360 |
| 5,721,439 A | * | 2/1998 | Lin ............................... 257/204 |
| 6,008,080 A | * | 12/1999 | Chuang et al. .............. 438/200 |
| 6,030,871 A | | 2/2000 | Eitan ............................ 438/276 |
| 6,034,415 A | * | 3/2000 | Johnson et al. .............. 257/621 |
| 6,046,087 A | | 4/2000 | Lin et al. ..................... 438/279 |
| 6,100,141 A | * | 8/2000 | Hsu ............................. 438/283 |
| 6,114,226 A | * | 9/2000 | Chang et al. ................ 438/510 |
| 6,171,891 B1 | * | 1/2001 | Lee et al. .................... 438/197 |
| 6,229,182 B1 | * | 5/2001 | Van Lieverloo ............. 257/355 |
| 6,268,256 B1 | * | 7/2001 | Kuo ............................. 438/305 |
| 6,444,511 B1 | * | 9/2002 | Wu et al. ..................... 438/199 |
| 6,514,839 B1 | * | 2/2003 | Ker et al. .................... 438/514 |
| 6,703,663 B1 | * | 3/2004 | Lee et al. .................... 257/336 |
| 2001/0010954 A1 | * | 8/2001 | Lin et al. ..................... 438/200 |
| 2002/0070408 A1 | * | 6/2002 | Schnaitter .................... 257/356 |
| 2002/0076876 A1 | * | 6/2002 | Ker et al. .................... 438/218 |
| 2003/0141551 A1 | * | 7/2003 | Hokazono et al. .......... 257/368 |

* cited by examiner

Primary Examiner—Amir Zarabian
Assistant Examiner—Ida M. Soward
(74) Attorney, Agent, or Firm—Ladas & Parry LLP

(57) ABSTRACT

ESD protection devices and methods of forming them are provided in this invention. By employing the thin gate oxide fabricated by a dual gate oxide process and breakdown-enhanced layers, ESD protection devices with a lower trigger voltage are provided. The NMOS structure for ESD protection according to the present invention has islands, a control gate and breakdown-enhanced layers. These islands as well as the breakdown-enhanced layers overlapping the drain region of the NMOS reduce the breakdown voltage of the PN junction in the drain region, thereby reducing the ESD trigger voltage and improving the ESD protection level of the NMOS. Furthermore, the invention is applicable to general integrated-circuit processes as well as various ESD protection devices.

14 Claims, 15 Drawing Sheets

ESD PROTECTION DEVICES AND METHODS TO REDUCE TRIGGER VOLTAGE

BACKGROUND OF THE INVENTION

1. Field of the Invention

The present invention relates to electrostatic discharge (ESD) protection devices. In particular, the present invention relates to ESD protection devices that have islands and breakdown-enhanced layers.

2. Description of the Related Art

As products based on integrated circuitry (ICs) become more delicate, they also become more vulnerable to impact from the external environment, especially ESD stress occurring when one pin of an IC is grounded and anther pin of the IC contacts an electrostatically-precharged object. Therefore, input pins, output pins, input/output pins, and the power-bus pins for an IC for communicating with external systems must all be well equipped with ESD protection devices or circuitry to meet the minimum level of ESD robustness required by commercial applications.

NMOS (Negative-type Metal On Semiconductor Field Effect Transistor), either with the gate grounded or with the gate coupled to a positive voltage during an ESD event, have commonly been used as primary ESD protection devices for ICs. It is well known that the drain contact of an NMOS must be kept a few microns apart from the gate of the NMOS. What is implied is that the drain side of an NMOS confronting ESD stress in the front line must have a distributed resistor connected in series between the channel under the gate and a drain contacts coupled to an IC pad, and the resistance of the distributed resistor must be larger than an acceptable value. If the ESD transient current starts to localize at a weak spot near the gate, it causes the entire ESD current to rush in, thereby causing local heating and eventually damaging the NMOS. On the other hand, the distributed resistor helps to raise the potential of the adjacent diffusion area, and hence induce a more uniform ESD current flow towards the whole channel.

The advanced salicide process, which forms silicide material on drain/source regions to reduce the resistance of active regions and speeds up the circuit operation rate, however, makes construction of the above-mentioned resistor more difficult and costly.

One known solution for the problems induced by the salicide process is to use the salicide block process, which blocks the formation of silicide on certain diffusion regions. However, this solution is inefficient due to the process complexity and the extra mask required.

U.S. Pat. No. 5,721,439 (hereafter referred as '439 patent) discloses an MOS structure comprising a number of isolated islands in the drain diffusion region (as shown in FIG. 1). The ESD transient current flows around these isolated islands from the drain contacts 10, toward the drain-gate edge, thereby increasing drain resistance to improve ESD protection.

U.S. Pat. No. 5,248,892 discloses an MOS structure comprising a resistor means whose width is substantially equal to the width of the active zone, wherein the resistor means comprises a number of strips of titanium silicide overlying a resistance zone (n-well) and extending substantially parallel to each to increase drain resistance.

U.S. Pat. No. 6,046,087 discloses an ESD protection device using a second gate as silicide-blocking mask for the drain region, wherein the second gate overlies an N-well region and separates the drain of the host transistor into two portions.

SUMMARY OF THE INVENTION

An object of the present invention is to reduce the ESD protection trigger voltage of an ESD protection device, thereby improving its ESD protection level.

The MOS (metal on semiconductor transistor) structure for ESD protection, according to the present invention, comprises an active region, a channel region, at least one first island, a doped drain region and a breakdown-enhanced layer. The active region is defined on a substrate of a second-type conductivity. The channel region separates the active region into a first drain/source region and a second drain/source region. The first island is formed on the first drain/source region and has a first conductive segment and a first gate oxide segment of the first thickness, where the first conductive segment is stacked on the first gate oxide segment. The doped drain region of a first-type conductivity is positioned in the first drain/source region and is defined substantially by a field oxide region and the channel region. The field oxide region can be a locos or trench isolation region. The breakdown-enhanced layer is formed in the first drain/source region and contacting with the doped drain region to reduce a breakdown voltage across the doped drain region and the substrate.

Inside the active region, there can be one or more breakdown-enhanced layers located at least within the first drain/source region. The conductivity type of the breakdown-enhanced layer can be the first-type or the second-type. Several kinds of processes, including pocket implantation, anti-punch-through implantation and ESD implantation, can be employed to form the breakdown-enhanced layer.

The MOS structure may be a field oxide MOS, which means the channel region has a field oxide or trench isolation stacked on the substrate, or a conventional MOS, which has a second gate oxide segment and a second conductive segment on the channel region. The second gate oxide segment can have the same thickness as the first gate oxide segment. Nevertheless, the second gate oxide segment may have a different thickness from the first gate oxide segment. This implies the MOS structure is manufactured by a dual-gate process flow, which generates two kinds of gate oxide on a wafer.

The existence of the island and the breakdown-enhanced layer reduces the breakdown voltage across the first drain/source region and the substrate, thereby, during an ESD event, increasing the response speed of the MOS structure and obtaining a higher ESD tolerant level.

The present invention further provides an electrostatic discharge protection device on a substrate of a second-type conductivity. The ESD protection device comprises a source region of a first-type conductivity, a drain region of the first-type conductivity, a first gate structure and a second gate structure. The source region can be coupled to a power rail and a pad via a contact. The second gate structure is placed between the source region and the drain region for controlling electric connection between the drain region and the source region. The first gate structure is substantially surrounded by the drain region, for distancing the contact from the first gate structure. The first gate structure and the second gate structure experience different treatments during manufacturing.

Experiencing different treatments means that, due to mask pattern variation, at least one of the manufacturing processes has significant influence on one of the two gate structures (the first and the second) but little or no influence at the other. For example, pocket implantation induces ions punching through the first gate structure while the second gate structure is protected by a photoresistance layer.

With proper design, a breakdown-enhanced layer can be formed to contact with the drain region and reduce the breakdown voltage across the drain region and the substrate thereunder, thereby strengthening ESD tolerance of the ESD protection device. As an option, it is advantageous that the breakdown-enhanced layer not formed within the source region of the MOS structure. This is because a breakdown-enhanced layer within the source region tends to reduce the source-side resistance, making it harder to turn the source junction forward biased and the MOS structure triggered during an ESD event.

The gate oxide thicknesses of the first and the second gate structures may be the same or different. In the later case, the breakdown-enhanced implant mask can be generated based on the first gate oxide definition mask.

The present invention further provides an electrostatic discharge protection device comprising an active region, a first gate structure and a second gate structure, at least one drain region of a first-type conductivity, at least one source region of the first-type conductivity, and a breakdown-enhanced layer. The active region is on a substrate of a second-type conductivity. The first gate structure and the second gate structure are both placed on the active region. The drain region and the source region can be respectively coupled to a pad. The source region can be coupled to a power rail. The breakdown-enhanced layer contacts the drain region to reduce a breakdown voltage across the drain region and the substrate.

BRIEF DESCRIPTION OF THE DRAWINGS

The present invention can be more fully understood by reading the subsequent detailed description in conjunction with the examples and references made to the accompanying drawings, wherein.

DETAILED DESCRIPTION OF THE PREFERRED EMBODIMENT

Figure 1:
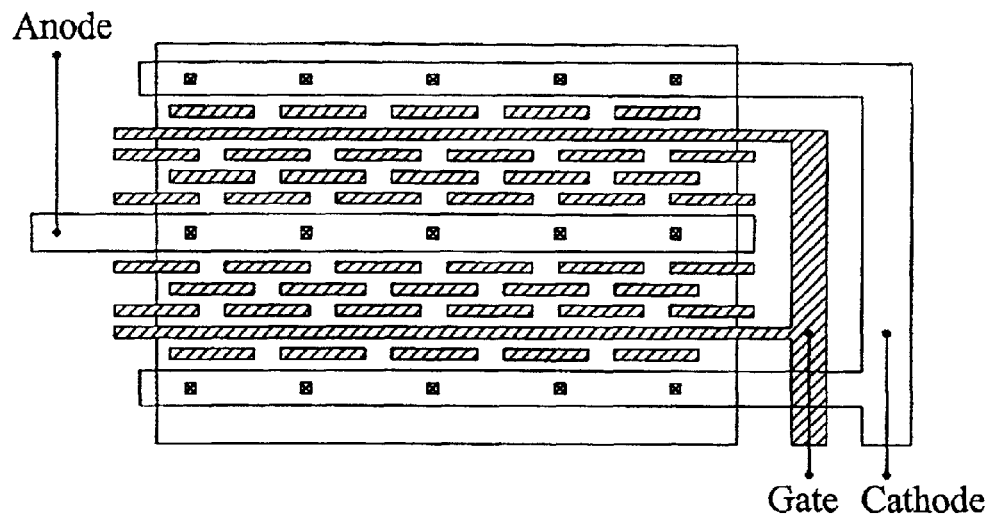
FIG. 1 is a conventional NMOS with isolated islands in drain diffusion region.
Figure 2:
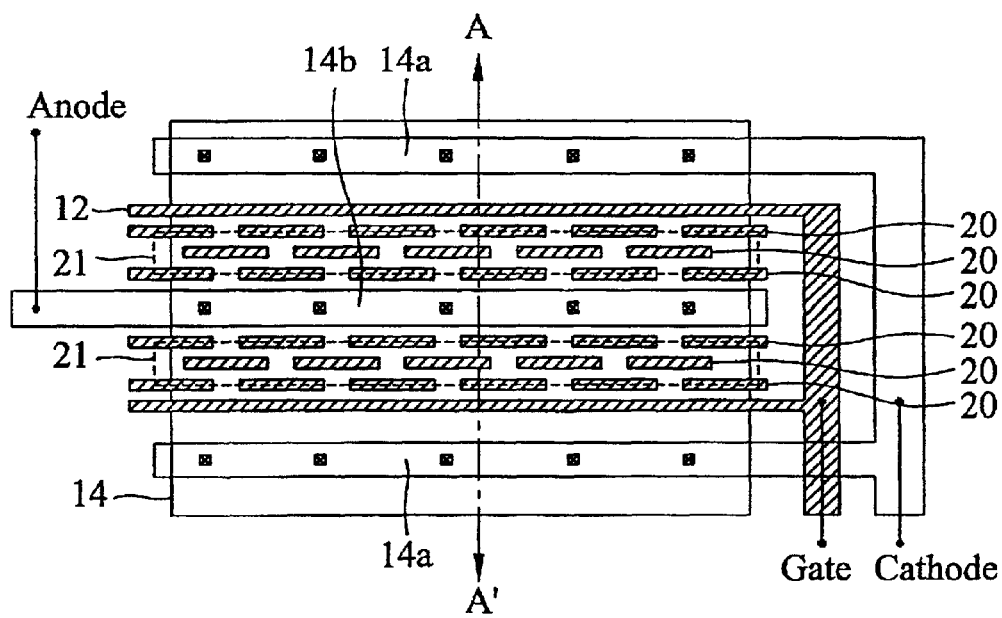
FIG. 2 shows a layout view of an NMOS structure according to the present invention.
Figure 3:
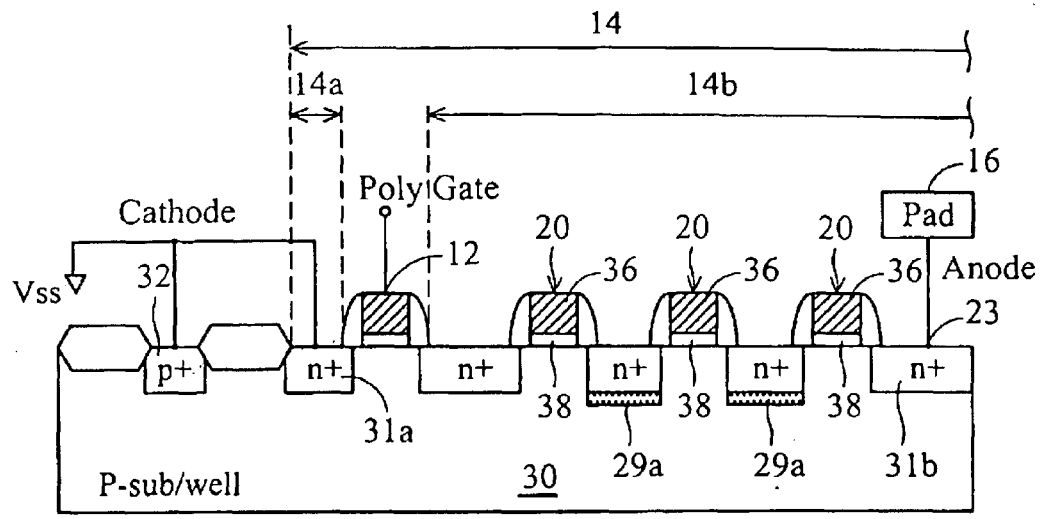
FIG. 3 is a cross-section of the NMOS structure in FIG. 2 along a portion of line A–A'.

FIG. 2 shows a layout view of an NMOS structure according to the present invention. FIG. 3 is a cross-section of the NMOS structure in FIG. 2 along a portion of line A–A'.

The ESD protection device in FIG. 2 is a multi-finger-type NMOS with two poly gates 12 coupled together. An active region 14 is surrounded by a field oxide (FOX) isolation region, which is typically formed by local oxidation (LOCOS) or shallow trench isolation (STI). The active region 14 is typically ion-implanted by negative-type ions and then annealed by thermal cycles to form heavily n-doped (n+) layers. The ion implant is blocked by any poly gate, poly segment or field oxide region present within the active region. Within the active region 14, two channel regions under the poly gates 12 are formed. The portion of the active region 14 between the two poly gates 12 is referred to as a drain diffusion region 14b, serving as an anode and coupled to a pad 16, and the portions of the active region 14 sandwiching the two poly gates in between are referred to as source diffusion regions 14a, serving as a cathode which can be coupled to a Vss power rail. The drain and source diffusion regions (14b and 14a) are separated by the poly gates 12 as well as the channel underneath the poly gates 12. Islands 20, each consisting of a poly segment 36 with a thin gate oxide 38 thereunder, are distributed in the drain diffusion region 14b. Some of these islands 20 partially overlap the drain diffusion region 14b, having a portion on the field oxide region and another portion on the drain diffusion region 14b. Some of these islands 20 are located within (or enclosed by) the drain diffusion region 14b. The exampled mask patterns 21 define the area implanted during ESD implantation, which increases the n+ or p+ dosage concentration of portion at the drain diffusion junction over the p-well/p-substrate 30.

In FIG. 3, from right to left, are a drain contact 23 in the drain diffusion region 14b, three rows of islands 20, a poly gate 12, a source diffusion region 14a, and finally, a p+ guard-ring region 32 (not shown in FIG. 2) in the p-well/p-substrate 30. The n+ drain layer 31b can be coupled to a pad; n+ source layer 14a and the p-well/p-substrate 30 can be coupled to the Vss power rail. A p-type ESD (P-ESD) layer 29a, due to the ESD implantation and the mask patterns, is under the n+ drain diffusion region 31b to reduce the breakdown-voltage across the n+ drain diffusion region 31b and the p-well/p-substrate 30. Alternatively, an n-type ESD (n-ESD) layer 29a around the n+ junction edge can be used to overlap the lightly doped LDD implant to reduce trigger voltage.

Islands 20 can disperse the current flow inside the drain diffusion region 14b more evenly and induce appropriate resistance between the poly gate 12 and the drain contact 23. P-ESD layer 29A lowers the breakdown voltage across the n+ drain layer 31b and the substrate 30, thereby speeding up the response rate of the MOS structure during an ESD event. The MOS structure of the present invention provides these three significant improvements and can have robust ESD tolerance.

Figure 4:
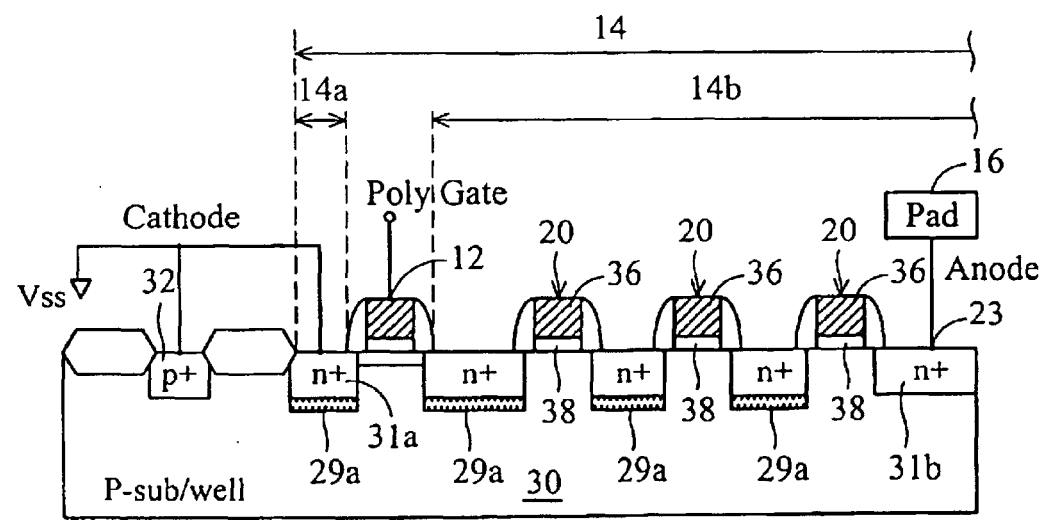
FIG. 4 is a cross-section of an NMOS structure that has P-ESD layers under each of n+ layers according to the present invention.

Depending on outline variation of the mask patterns 21, the location of the P-ESD layer 29a can be changed. For example, the P-ESD layer 29a can be extended to be under the edge of the poly gate 12, or to be under the n+ source layer 31a, as shown in FIG. 4. As still another example, the mask patterns 21 can be expanded to cover all islands 20, but not the poly gate 12.

Figure 5:
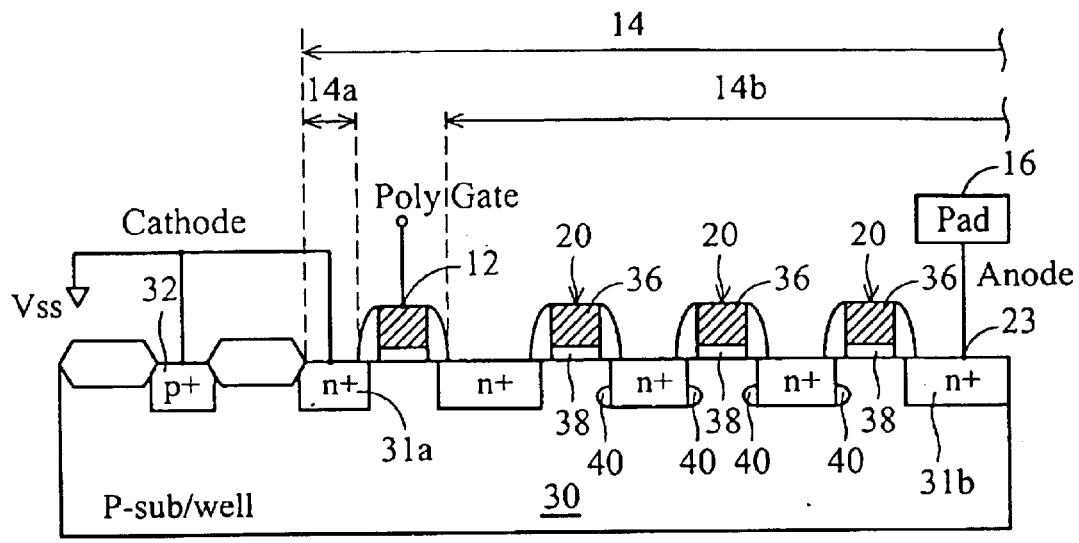
FIG. 5 is a cross-section of an NMOS structure according to the present invention, employing pocket layers to reducing the breakdown voltage.

In addition to ESD implantation, several processes during the process flow can be selected as alternatives for lowering the breakdown voltage. Pocket implantation, for example, is one of them. Pocket implantation in the art, as taught in Ref. U.S. Pat. No. 6,030,871, is used to form p+ pockets laterally attaching to n+ drain/source layers. These P+ pockets can move the location of the maximum electric field slightly away from the substrate surface during normal operation, and, as a result, lessen the damage induced by hot electrons. In FIG. 5, p+ pockets 40 in the MOS structure are only formed within the drain diffusion region 14b, have extra function of reducing the breakdown voltage, and create junction breakdown much earlier during an ESD event. The mask patterns for pocket implantation to form p+ pockets 40 are similar with the mask patterns 21 in FIG. 2.

Figure 6:
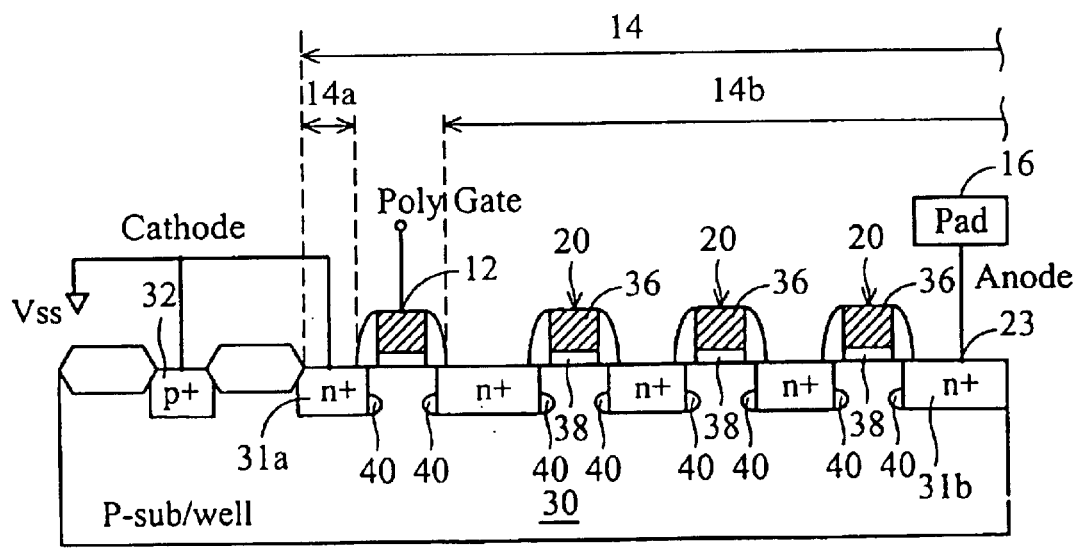
FIG. 6 shows n+ pockets located under each island and under the poly gate.

In view of the ESD current distribution requirement, p+ pockets 40 can be selectively formed under any island or any poly gate within the MOS structure. FIG. 6 shows n+ pockets 40 located under each island and under the poly gate.

Figure 7:
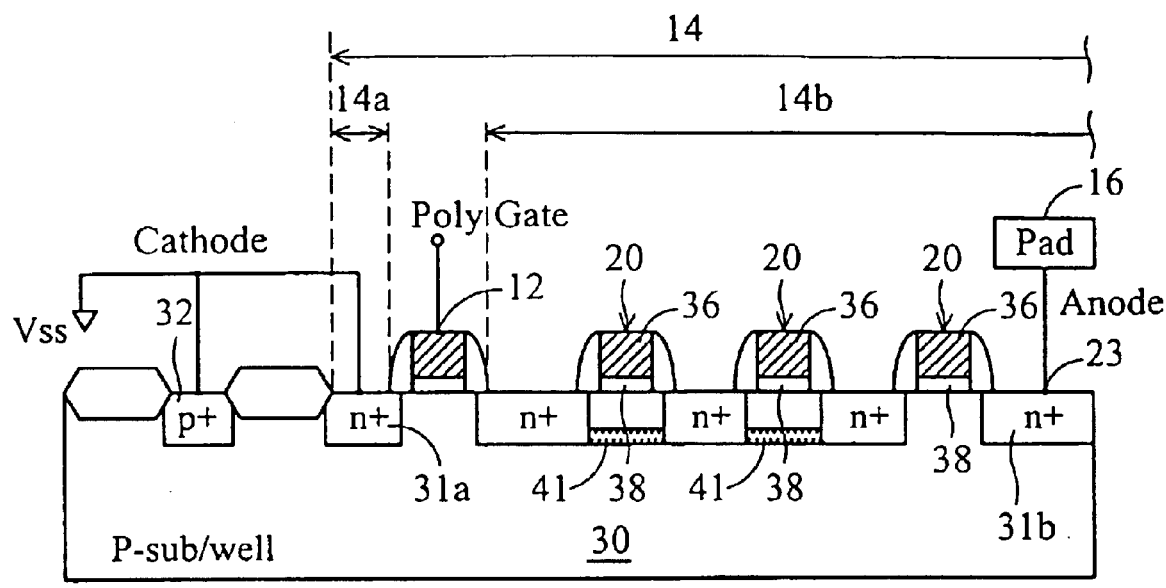
FIG. 7 shows a cross-section with p-type anti-punch-through layers 41 only within the drain diffusion region.
Figure 8:
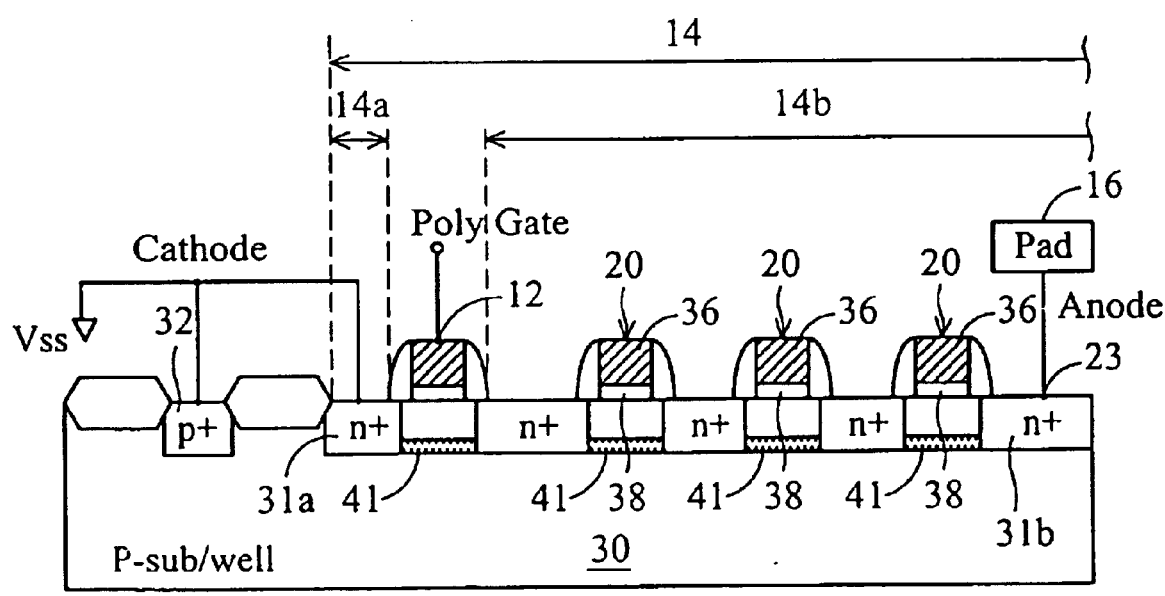
FIG. 8 shows a cross-section with p-type anti-punch-through layers under each of the gate structures, including islands and the poly gate.

Another process candidate to reduce breakdown voltage is anti-punch-through implantation, which is, as in the Ref. U.S. Pat. No. 6,093,591, used to suppress short channel effect. As the anti-punch-through implantation increasing the dosage of portion of the p-substrate/p-well to form a p-type anti-punch-through layer, it can also contribute to decrease the breakdown voltage. FIG. 7 shows a cross-section with p-type anti-punch layers 41 only within the drain diffusion region 14b. FIG. 8, in comparison, shows a cross-section with p-type anti-punch-through layers 41 under each of the gate structures, including islands 20 and the poly gate 12.

Employing anti-punch-through implantation or pocket implantation to generate breakdown-enhanced layers, such as anti-punch-through layers and p+ pockets, requires neither extra masks nor relative processes since these two processes are already commonly included in CMOS process flow.

The present invention can also be implemented by dual-gate IC process flow, which builds up two different gate oxide thicknesses on a single wafer, and obtains extra features and benefits.

As an exampled dual-gate process, a thin oxide layer of 40 angstrom gate oxide is used for fabricating minimum 0.25 u MOS transistors for 2.5V operation, while a thick oxide layer of 70 angstrom gate oxide is used for fabricating minimum 0.35 u MOS transistors for 3.3V operation. Since the short channel effect is more pronounced in the minimum 0.25 u thin-oxide transistors than the minimum 0.35 u thick-oxide transistors, an additional implant such as pocket implant or anti-punch-through implant is implanted for the thin-oxide transistors.

Figure 9:
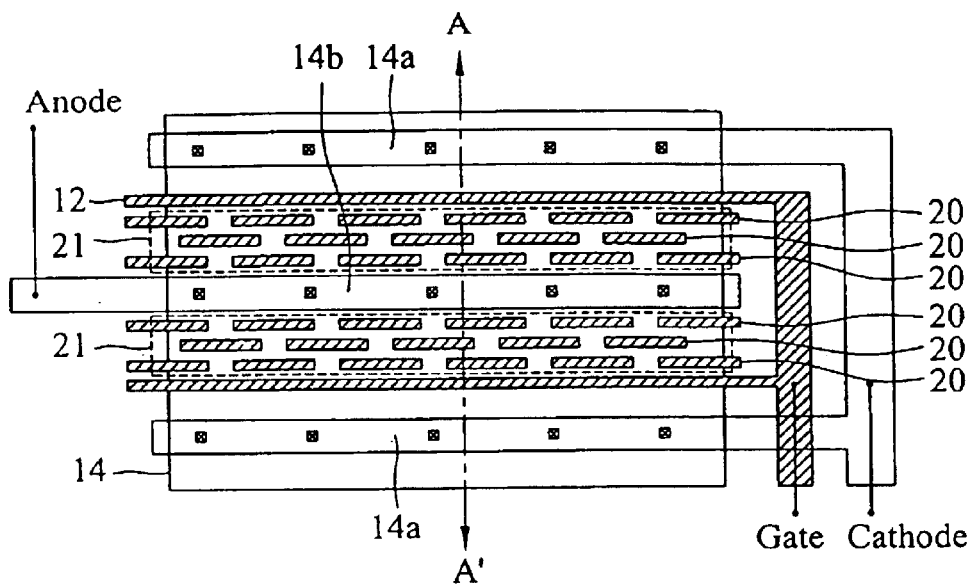
FIG. 9 shows a layout view of an NMOS structure fabricated by a dual gate IC process flow according to the present invention.
Figure 10:
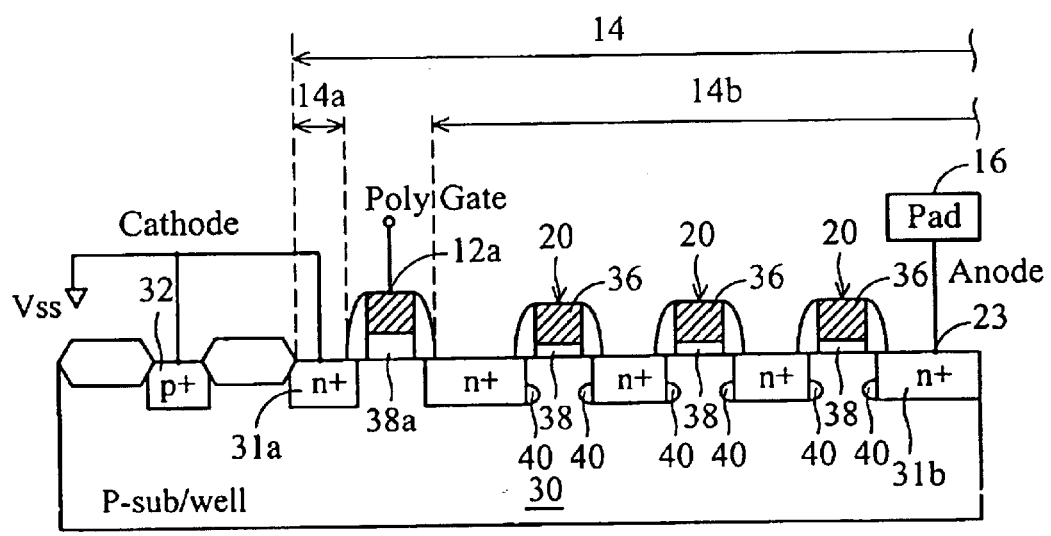
FIG. 10 shows a cross-section of the NMOS structure in FIG. 9 along a portion of line A–A'.
Figure 11:
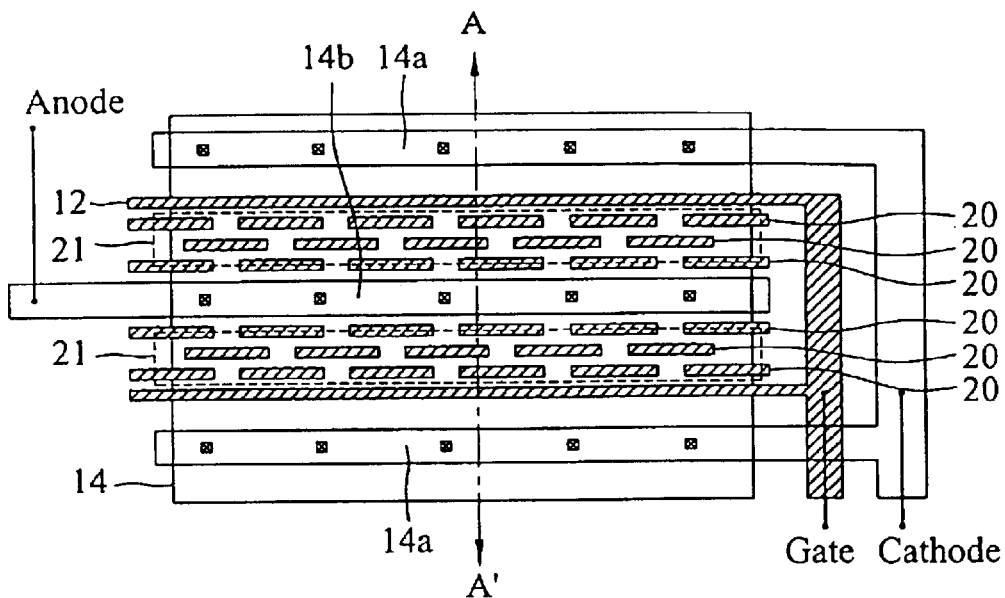
FIG. 11 shows a layout view of an NMOS structure fabricated by a dual gate IC process flow and islands having different gate oxide thicknesses.

FIG. 9 shows a layout view of an NMOS structure fabricated by a dual gate IC process flow according to the present invention. FIG. 10 is a cross-section of the NMOS structure in FIG. 9 along a portion of line A–A'.

FIG. 9 is similar with FIG. 2 and FIG. 10 is similar with FIG. 5, except in the thickness difference between the gate oxide segments 38 of the island 20 and that of the poly gate 12a, and the pocket implant mask covers all islands 20, but not the gate oxide segment 38. The poly gate 12a, which controls electric connection between the n+ drain layer 31b and the n+ source layer 31a, has a thick gate oxide segment 38a, which can sustain higher voltage stress without breakdown. The islands 20, each having a similar gate structure, have thin gate oxide segments 38. According to experiments, the gate structure with a thin gate oxide segment plus the extra (pocket) implant induces a lower breakdown voltage for the associated source/drain layers than that gate structure with a thick gate oxide segment does. Therefore, in FIGS. 9 and 10, islands 20 not only disperse the current flow in the n+ drain layer 31b, but also contribute to lower the breakdown voltage across the n+ drain layer 31b and the p-substrate/p-well 30, as well as the P+ pocket implant 40 does.

All the islands in the drain diffusion region 14b need not have a thin gate oxide segment. As shown in FIGS. 11–14, only the islands 20 at the row adjacent to the poly gate 12a have thin oxide segments 38 while other islands 20 have thick oxide segments 38a.

Figure 12:
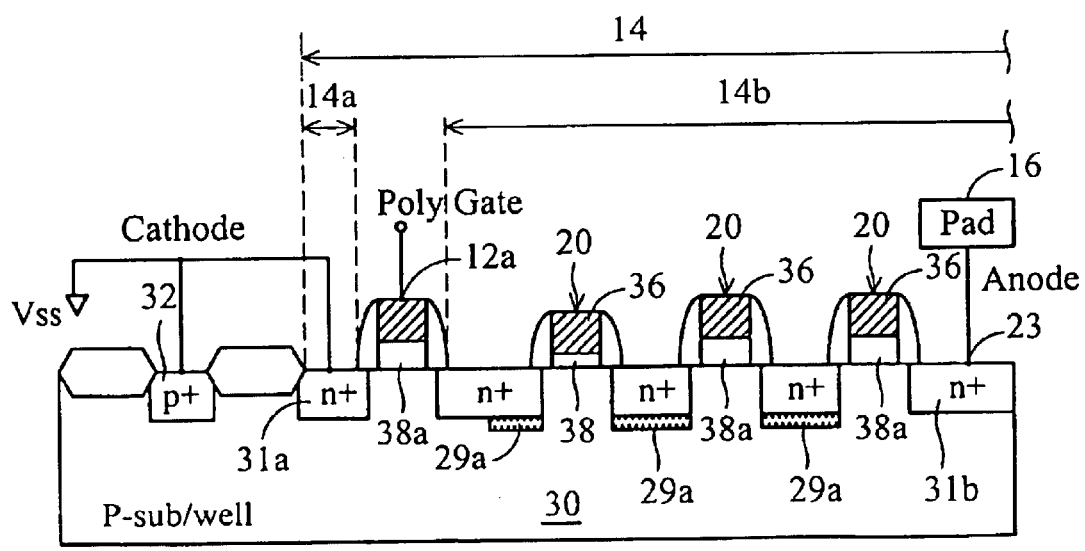
FIG. 12 shows a cross-section of the NMOS structure in FIG. 11 along a portion of line A–A'.
Figure 13:
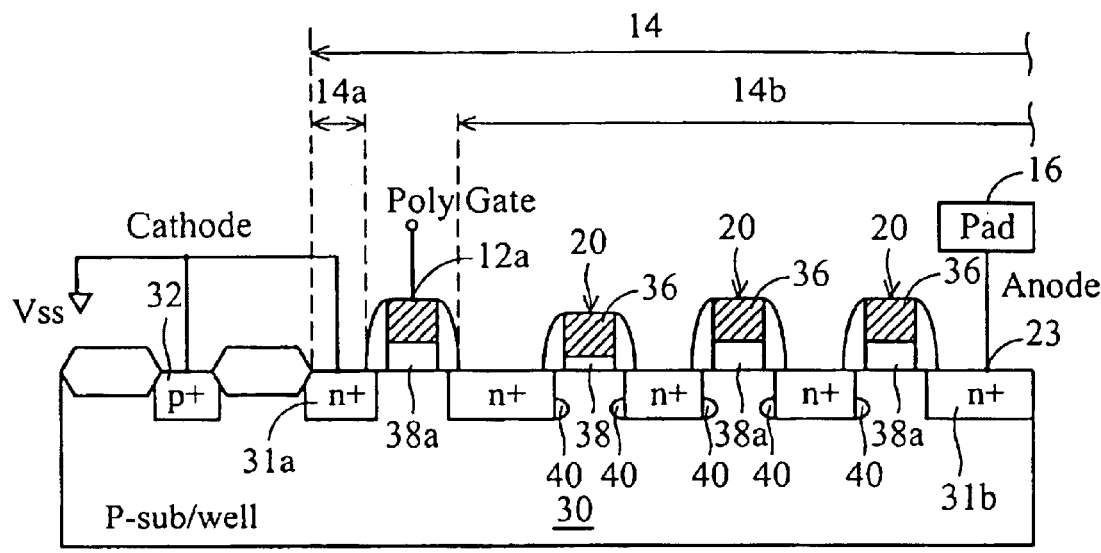
FIG. 13 shows a cross-section of the NMOS similar to FIG. 12 but implemented with pockets.
Figure 14:
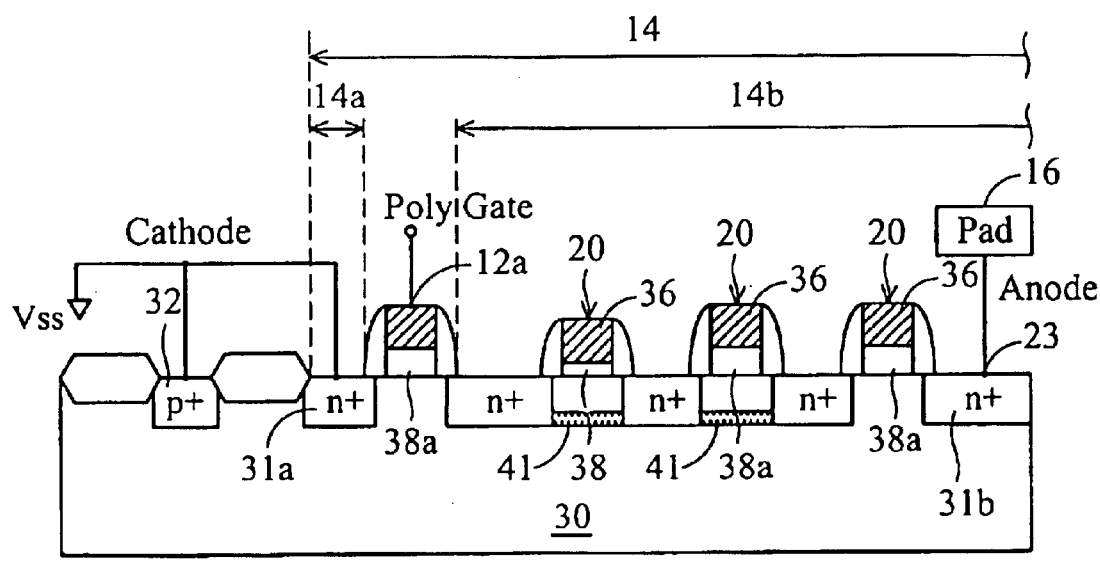
FIG. 14 shows a cross-section of the NMOS similar to FIG. 12 but implemented with pockets.

Furthermore, the pocket implant layers 40 in FIG. 10 can be replaced by the ESD implant layers 29a, the pocket implant 40 or anti-punch-through layer 41, as respectively shown in FIGS. 12, 13 and 14.

Figure 15:
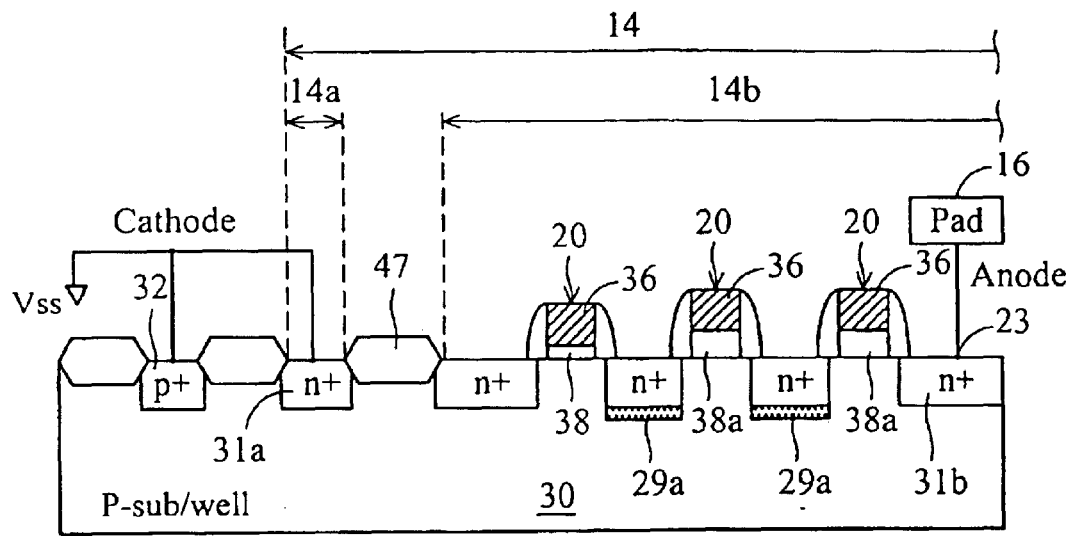
FIG. 15 shows a field oxide MOS utilizing P-ESD implantation.
Figure 16:
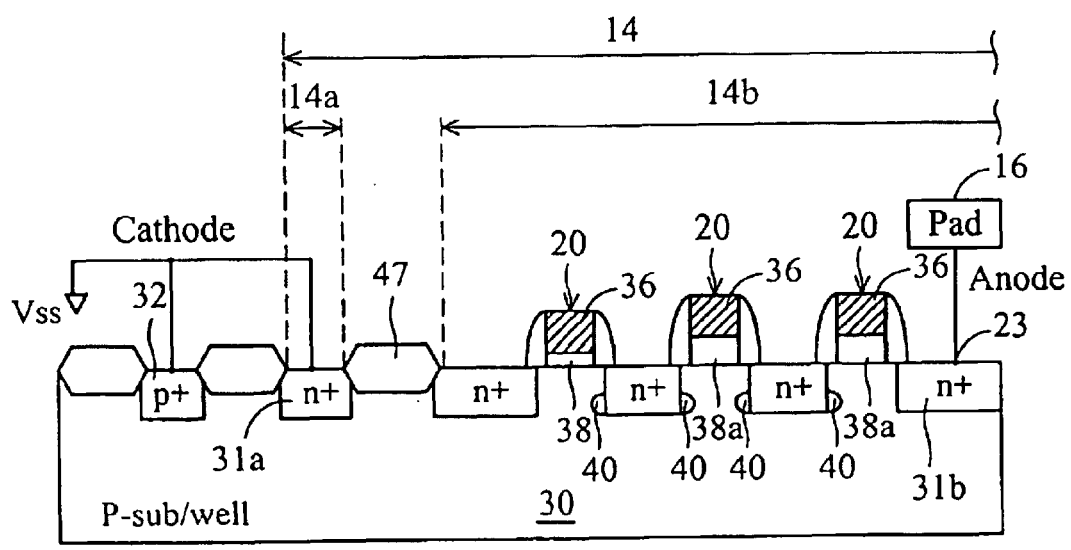
FIG. 16 shows a field oxide MOS pocket implantation.
Figure 17:
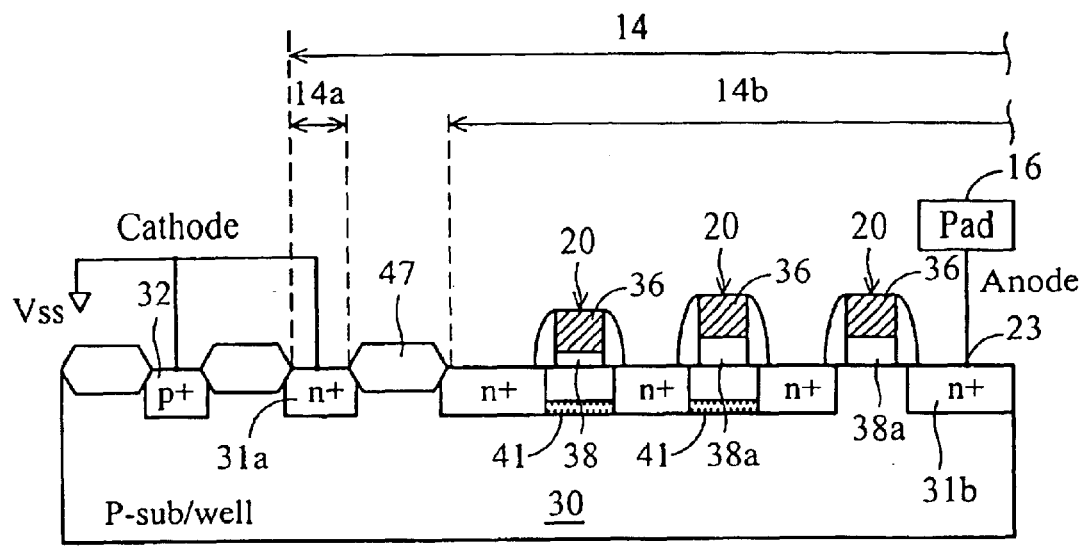
FIG. 17 shows a field oxide MOS anti-punch-through implantation.

FIG. 15 shows a field oxide MOS utilizing the present invention. As shown in FIG. 15, a field oxide 47 replaces the poly gate 12 in FIG. 12 to construct a field oxide MOS. This field oxide MOS in FIG. 15 also possesses the advantages in ESD protection as the MOS structure shown in FIG. 12. FIGS. 16 and 17, respectively employing p+ pockets 40 and anti-punch-through layers 41, are two modified illustrates according to the FIG. 15.

Figure 18:
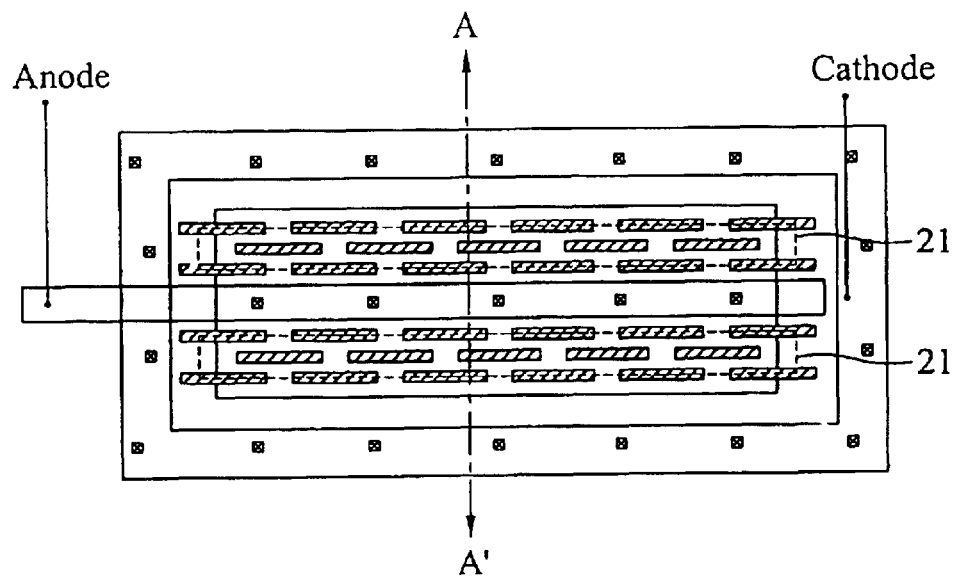
FIG. 18 is a layout example of a diode according to the present invention.
Figure 19:
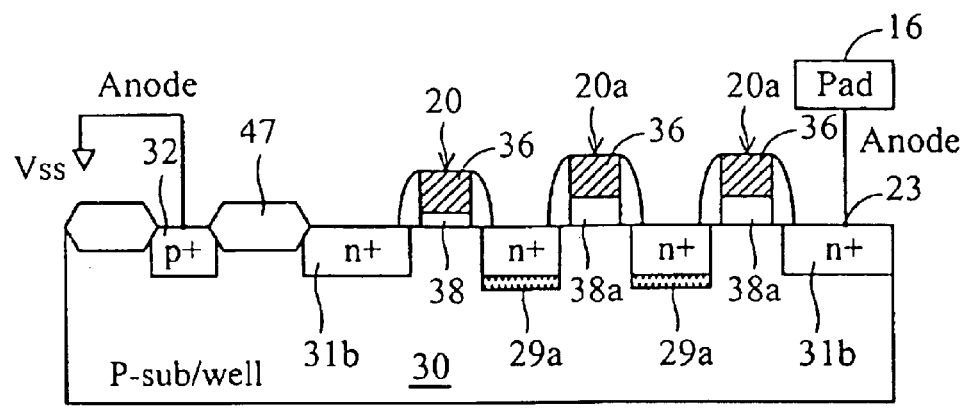
FIG. 19 is a cross-section of the diode along portion of AA' line in FIG. 18.

The essence of the present invention can also be applied to a diode structure, as shown in FIGS. 18 and 19. FIG. 18 is a layout example of a diode according to the present invention; FIG. 19 is a cross-section of the diode along portion of AA' line in FIG. 18. There are two kinds of islands inside the active region, which is enclosed by a field oxide region; some (symbolized as 20a) have thick gate oxide segments 38a, and the others (symbolized as 20) have thin gate oxide segments 38. The n+ layer 31b, defined by the field oxide region and the islands, serves as an anode of a diode and is coupled to a pad 16. P-ESD or N-ESD slayer 29a, defined by the mask patterns, contacts the bottom side of the n+ layer 31b. The substrate 30, via the p+ layer 32 and a contact, serves as a cathode of a diode and is coupled to a ground power rail Vss. The islands 20 with thin gate segments and the P-ESD layers 29a all contribute to the decrement of the breakdown voltage of the diode.

Figure 20:
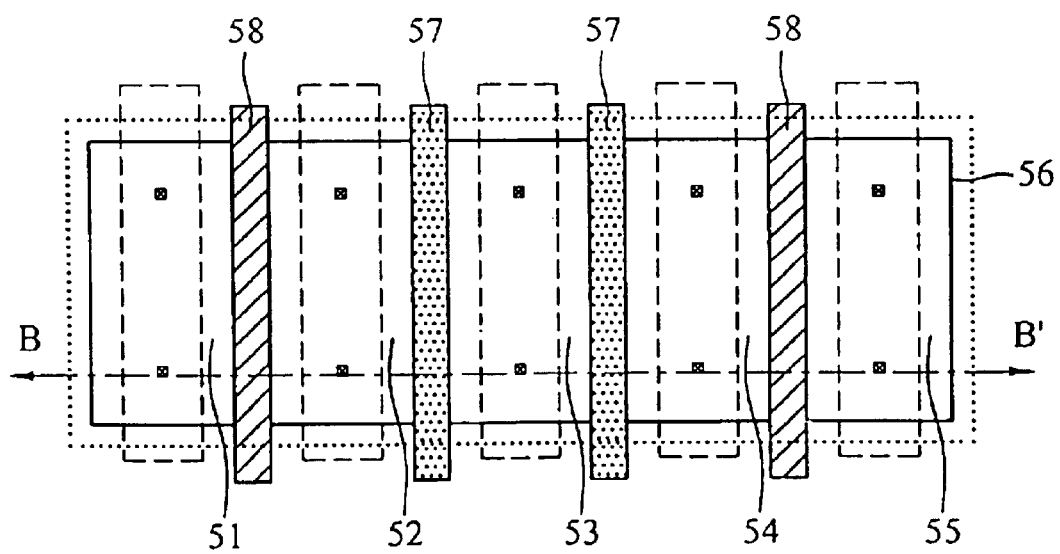
FIG. 20 shows a layout example that has four MOS in an active region.

FIG. 20 shows a layout example with four MOS in an active region 56. The two MOS 57 at the center region have thick gate oxide segments, but the two MOS 58 at the edge region have thin gate oxide segments. Separated by the four MOS, five n+ layers, symbolized as 51, 52, 53, 54 and 55, are formed in the active region 56.

Figure 21:
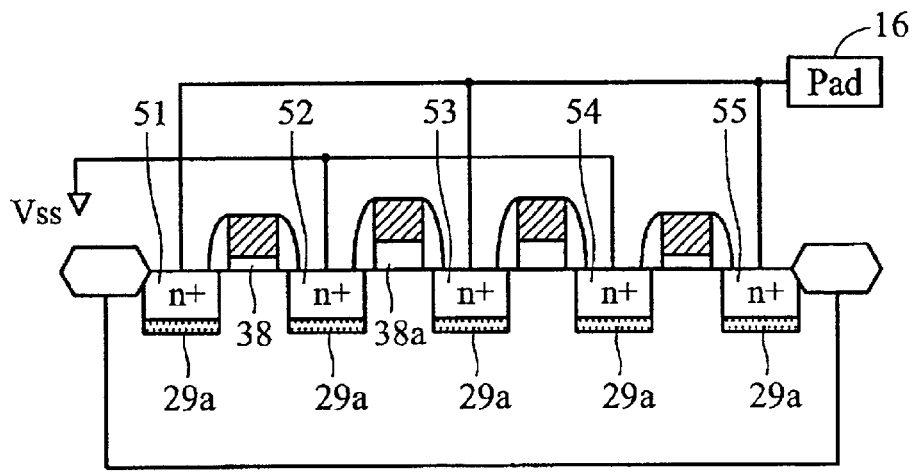
FIG. 21 illustrates a cross-section along line BB' and an electric connection example.

FIG. 21 illustrates a cross-section along line BB' and an electric connection example. The n+ layers 51, 53 and 55 are coupled to a pad. The n+ layers 52 and 54 are coupled to the ground rail. Each of the n+ layers has a P-ESD or an N-ESD layer 29a thererunder. The contribution for the thin gate segments and the ESD layer 29a to the decrement of the breakdown voltage can be logistically identified via the similar discussion in the precedent embodiments.

Figure 22:
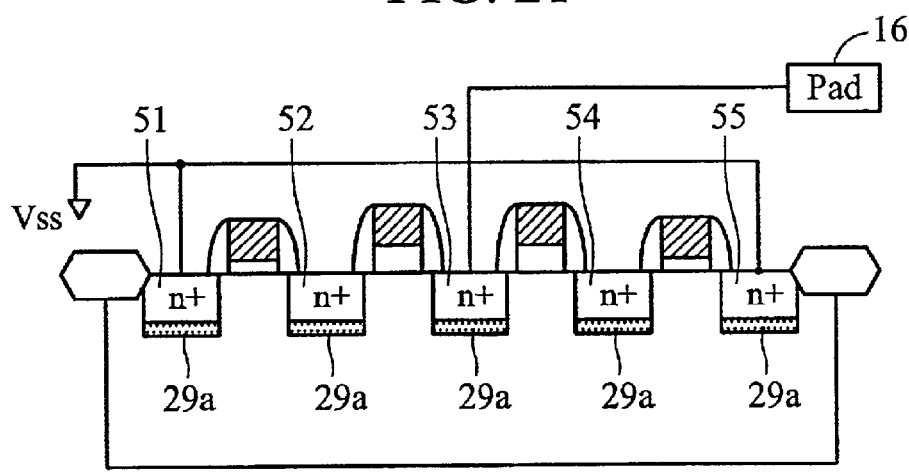
FIG. 22 illustrates a cross-section along line BB' as well as another electric connection example.

FIG. 22 illustrates another cross-section and electric connection example. The n+ layer 53 is coupled to a pad 16. The n+ layers 51 and 53 are coupled to the ground rail Vss. Each of the n+ layers has a P-ESD layer 29a there under.

Figure 23:
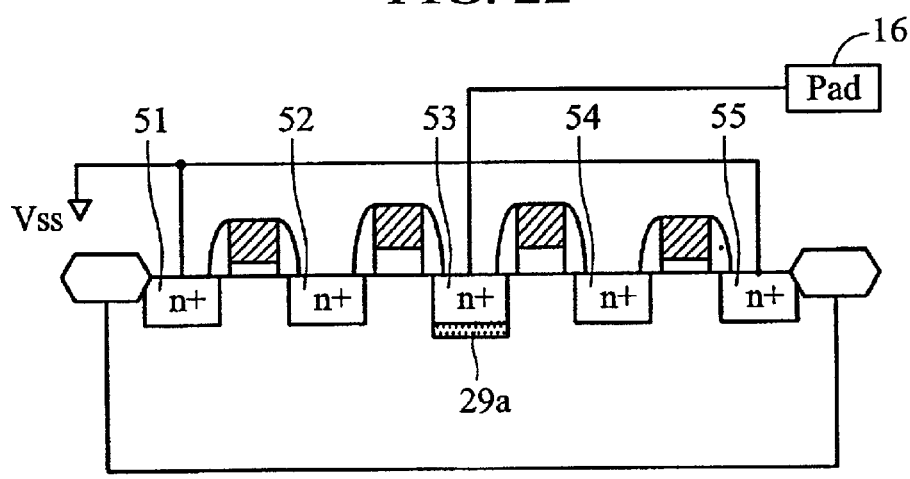
FIG. 23 illustrates another cross-section as well as an electric connection example.

As shown in FIG. 23, only n+ layer 53 has a P-ESD or N-ESD layer 29a thereunder. If any ESD layer 29a is placed under any n+ layer coupled to the pad 16, the coupled n+ layer has a lower breakdown voltage than the others and the purpose of increase ESD discharge protection is achieved.

FIGS. 24A to 24G depict the cross-sections of the ESD protection device according to the present invention in different fabrication processes.

Figure 24A:
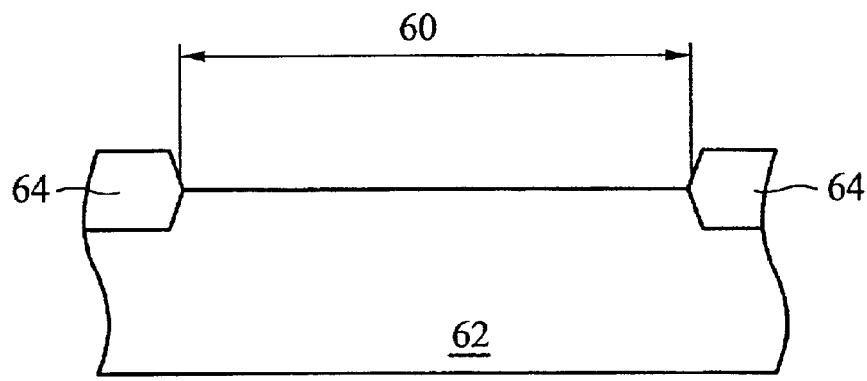
FIGS. 24A to 24G depict the cross-sections of the ESD protection device according to the present invention in different fabrication processes.

The semiconductor wafer in FIG. 24A has a p-substrate 62. The surface of the p-substrate 62 has an active region 60 surrounded by a field oxide (isolation) region 64. The field oxide region 64 is typically formed by LOCOS or STI.

Figure 24B:
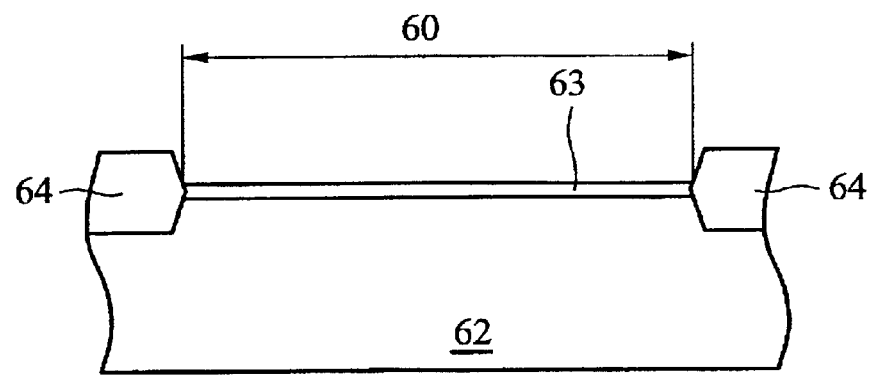

A gate oxide 63 is then formed on the active region 60, as shown in FIG. 24B, by oxidation or CVD (chemical vapor deposition).

Figure 24C:
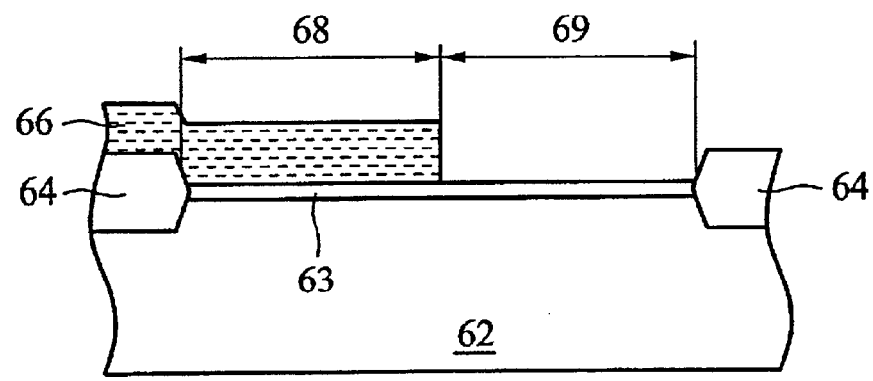

FIG. 24C depicts a developed photoresist film 66 formed on the semiconductor wafer, where a portion, defined as a second region 68, of the active region 60 to form a thick gate oxide is covered by the photoresist film 66.

Figure 24D:
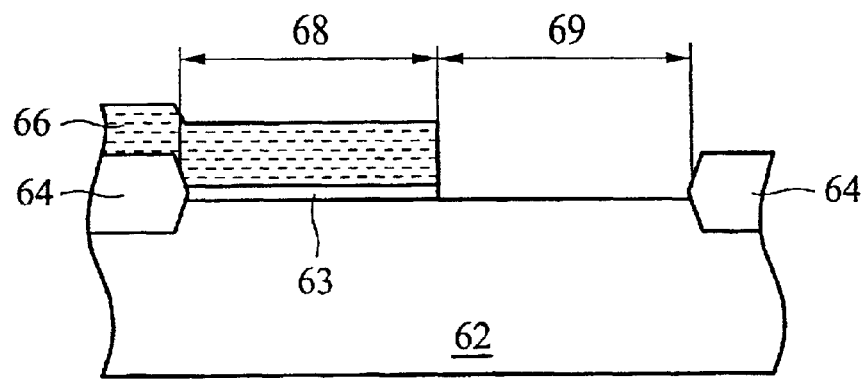

The gate oxide formed in the active region 60 but uncovered by the photoresist film is removed, as shown in FIG. 24D, by conventional methods, such as wet etch or dry etch. This portion of the active region 60 has no gate oxide on it and is defined as a first region 69.

Figure 24E:
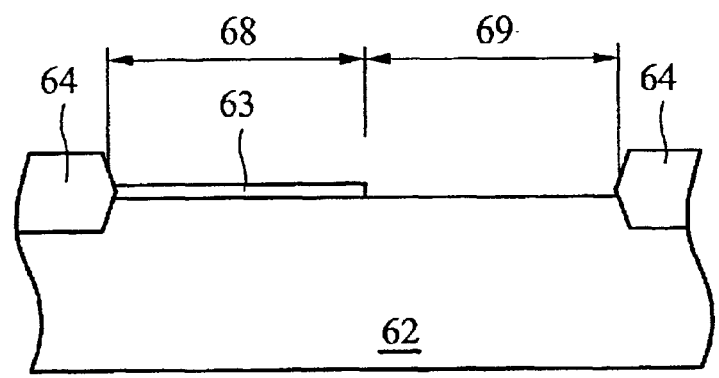

FIG. 24E depicts the photoresist film 66 in FIG. 24D being removed.

Figure 24F:
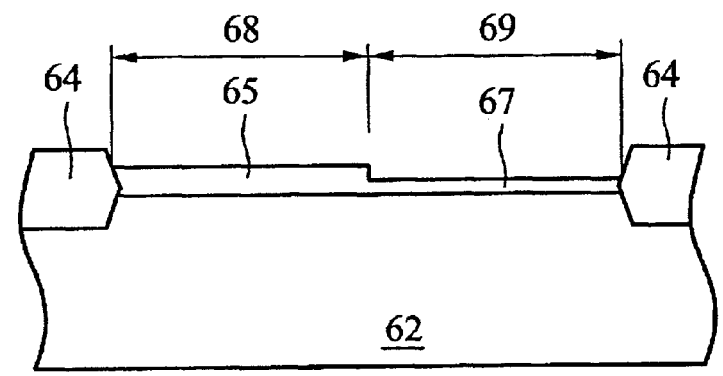

The gate oxide 63 on the second region is thickened to form a thick gate oxide 65 while a thin gate oxide 67 is formed on the first region, as shown in FIG. 24F. Typically, this step is performed by oxidation, which oxidizes both the surfaces of the first region and the second region.

Figure 24G:
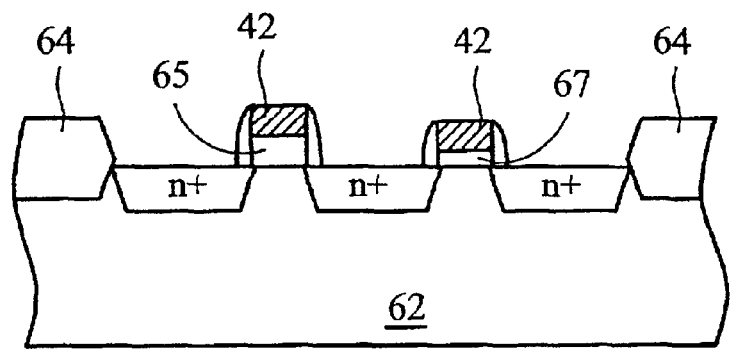

Please refer to FIG. 24G. A poly-silicon (poly) film is then formed on the semiconductor wafer. A lithography process and an etching process are then performed to pattern the poly film, such that two gate structures are primarily formed in the same active region 60. By conventional fabrication processes, these two gate structures can have spacers formed against their sidewalls and n+ diffusion region(s) as well as n− diffusion region(s) around them, as shown in FIG. 24G. Furthermore, salicide can be optional to form silicide film(s) on the surface of the n+ diffusion region(s). These two gate structures differ at least by the thickness of the gate oxide. That in the second region has a thick gate oxide, but that in the first region has a thin gate oxide. These two gate structures can act as different devices, depending upon their application. For example, if that in the second region is laid across the active region and is biased under a certain voltage during normal circuit operation, it serves as a gate of an NMOS. If that in the first region has a floating poly segment, it is an island overlapping the active region.

Figure 25:
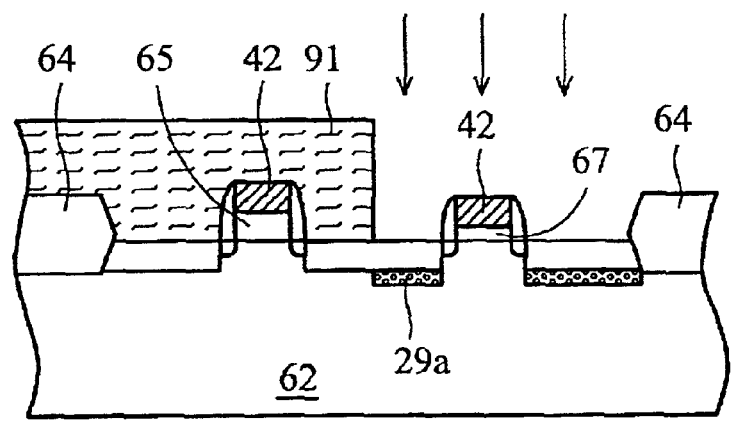
FIG. 25 depicts ESD implantation and the formation of a P-ESD layer.

ESD implantation is usually performed after the gate structure is finished. FIG. 25 depicts ESD implantation as indicated with the arrows and the formation of a P-ESD or N-ESD layer 29a. A photoresistance layer 91 protects the regions that needn't be implanted. The two gate structures also serve as two shields defining the area to be implanted.

Figure 26:
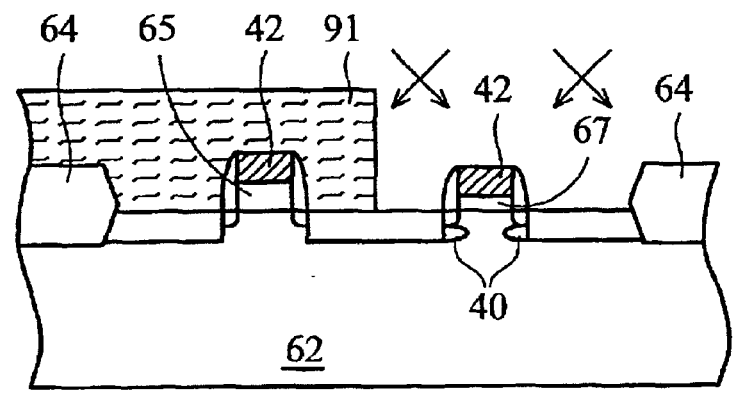
FIG. 26 depicts pocket implantation and the formation of n+ pockets.

Pocket implantation is also usually performed after the gate structure is finished. FIG. 26 depicts pocket implantation and the formation of p+ pockets 40. Pocket implantation implants the substrate in a large angle (as the arrows indicated) to form the p+ pockets under the gate structures.

Figure 27A:
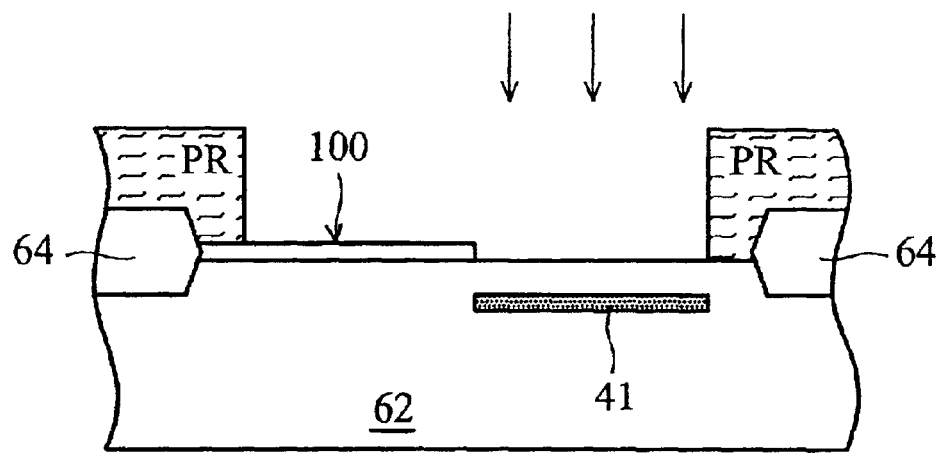
FIG. 27A depicts anti-punch-through implantation and the formation of an anti-punch-through layer.
Figure 27B:
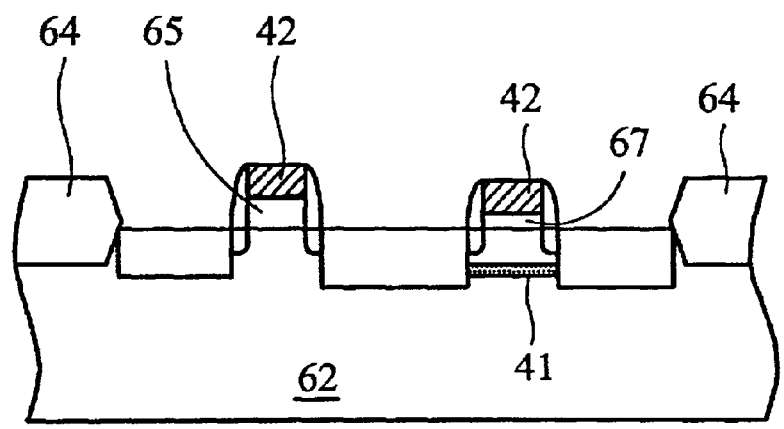
FIG. 27B shows the final MOS structure according the FIG. 27A.

Anti-punch-through implantation is usually performed before the gate structure is finished. FIG. 27A depicts anti-punch-through implantation and the formation of an anti-punch-through layer 41. The layer 100 is an oxide layer. FIG. 27B shows the final MOS structure according the FIG. 27A.

As a viable option, the photo mask for the additional implant processing can be automatically generated from the thin-oxide definition mask. And thus all thin-gate structures, including all on-chip MOS transistors with thin-gate oxide and any polysilicon islands with thin gate oxide, receive the additional implant. Accordingly, the additional implant further reduces the ESD trigger voltage of the thin-oxide island structure.

As shown in FIGS. 5–8, 10, 12–17, 19 and 23, a first doped (diffusion) junction adjacent to an island structure and receiving the additional implant have a different doping profile from a second doped (diffusion) junction adjacent to a gate structure and without receiving the additional implant. Accordingly, the island and the gate structures have different doping profiles in their respective adjacent junctions due to receiving different implant treatments.

As shown in FIGS. 3, 5, 7, 10, 12–17, 19 and 23, there is an additional implant in the drain region for reducing ESD trigger voltage, but not in the source region of the transistor. There is an advantage of not having the additional implant in the source region of the transistor as it tends to reduce the source-side resistance, which makes forward-biasing of the source junction for triggering the transistor into snap back during an ESD event more difficult.

Finally, while the invention has been described by way of examples and in terms of the preferred embodiments, it is to be understood that the invention is not limited to the disclosed embodiments. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A MOS (metal on semiconductor transistor) structure for ESD protection, comprising:
    an active region, defined on a substrate of a second-type conductivity;
    a channel region separating the active region into a first drain/source region and a second drain/source region;
    at least one first island, formed within and completely surrounded by the first drain/source region and having a first conductive segment and a first gate oxide segment of the first thickness, the first conductive segment being stacked on the first gate oxide segment;
    a doped drain region of a first-type conductivity in the first drain/source region, defined substantially by a field oxide region, the channel region and the at least one first island; and
    a breakdown-enhanced layer, formed in the first drain/source region and contacting the doped drain region, to reduce a breakdown voltage across the doped drain region and the substrate.

2. The MOS structure as claimed in claim 1, wherein the MOS structure has, within the active region, two breakdown-enhanced layers with the same depth and the same dosage on different sides of the channel region, and one of the breakdown-enhanced layers is inside the first drain/source region while another is outside the first drain/source region.

3. The MOS structure as claimed in claim 1, wherein the breakdown-enhanced layer has the first-type conductivity.

4. The MOS structure as claimed in claim 1, wherein the breakdown-enhanced layer also forms pocket-implanted structures of internal MOS.

5. The MOS structure as claimed in claim 1, wherein the breakdown-enhanced layer has the second-type conductivity.

6. The MOS structure as claimed in claim 1, wherein the breakdown-enhanced layer also forms anti-punch-through structures of internal MOS.

7. The MOS structure as claimed in claim 1, wherein the breakdown-enhanced layer is formed under the doped drain region.

8. The MOS structure as claimed in claim 1, wherein the channel region has a gate structure consisting of a second conductive segment and a second gate oxide segment, the second conductive segment being stacked on the second gate oxide segment.

9. The MOS structure as claimed in claim 8, wherein the second gate oxide and the first gate oxide have the same thickness.

10. The MOS structure as claimed in claim 8, wherein the second gate oxide and the first gate oxide have different thicknesses.

11. The MOS structure as claimed in claim 10, wherein the second gate oxide is thicker than the first gate oxide.

12. The MOS structure as claimed in claim 11, wherein the breakdown-enhanced layer is formed near the at least one first island and in an internal-circuit MOS transistor with the first gate oxide thickness simultaneously.

13. The MOS structure as claimed in claim 1, wherein the breakdown-enhanced layer is not formed in the second drain/source region.

14. The MOS structure as claimed in claim 1, wherein the channel region has a field oxide stacked on the substrate.

* * * * *